United States Patent
Chen

(10) Patent No.: US 10,554,922 B2
(45) Date of Patent: Feb. 4, 2020

(54) METHOD FOR REDUCING POWER CONSUMPTION OF POWER SUPPLY, POWER SUPPLY AUTOMATICALLY REDUCING POWER CONSUMPTION, AND TELEVISION

(71) Applicant: SHENZHEN SKYWORTH-RGB ELECTRONIC CO., LTD., Guangdong (CN)

(72) Inventor: Jianzhong Chen, Guangdong (CN)

(73) Assignee: SHENZHEN SKYWORTH-RGB ELECTRONIC CO., LTD., Guangdong (CN)

(*) Notice: Subject to any disclaimer, the term of this patent is extended or adjusted under 35 U.S.C. 154(b) by 0 days.

(21) Appl. No.: 16/260,665

(22) Filed: Jan. 29, 2019

(65) Prior Publication Data
US 2019/0158776 A1    May 23, 2019

Related U.S. Application Data

(63) Continuation of application No. PCT/CN2017/073553, filed on Feb. 15, 2017.

(51) Int. Cl.
*H05B 37/02* (2006.01)
*H05B 33/08* (2006.01)
(Continued)

(52) U.S. Cl.
CPC ............ *H04N 5/63* (2013.01); *G05B 13/021* (2013.01); *G06F 1/3265* (2013.01); *H02M 2001/0032* (2013.01)

(58) Field of Classification Search
CPC .................................... H05B 37/02; H05B 37/0227; H05B 37/0272; H05B 33/08; H05B 33/0815; H05B 33/0842; H05B 33/0845; H05B 33/0854; H04N 5/63; G05B 13/021; G06F 1/3265; H02M 2001/0032; H02M 2001/0035; H02M 3/3376
See application file for complete search history.

(56) References Cited

U.S. PATENT DOCUMENTS 8,953,341 B2 * 2/2015 Fahlenkamp ..... H02M 3/33553
363/21.01

FOREIGN PATENT DOCUMENTS

| CN | 201039000 | 3/2008 |
|---|---|---|
| CN | 202495882 | 10/2012 |

(Continued)

OTHER PUBLICATIONS

International Search Report of PCT/CN2017/073553, dated Mar. 21, 2017.

*Primary Examiner* — Jimmy T Vu
(74) *Attorney, Agent, or Firm* — Duane Morris LLP

(57) ABSTRACT

Provided are a method for reducing the power consumption of a power supply, a power supply capable of automatically reducing power consumption, and a television. The power supply includes: a voltage sampling circuit, an optocoupler feedback circuit, a deep standby control circuit, a power supply management circuit and an output rectifier filter. The output rectifier filter includes an output capacitor. The feedback amount (a second level or a first level) of the optocoupler feedback circuit changes as the charge amount of the output capacitor changes, intermittently controlling the power supply management circuit to stop working while achieving a constant voltage output.

15 Claims, 6 Drawing Sheets

(51) Int. Cl.
*H02M 3/33* (2006.01)
*H04N 5/63* (2006.01)
*G05B 13/02* (2006.01)
*G06F 1/3234* (2019.01)
*H02M 1/00* (2006.01)

(56) References Cited

FOREIGN PATENT DOCUMENTS

| | | |
|---|---|---|
| CN | 202535272 | 11/2012 |
| CN | 202798444 | 3/2013 |
| CN | 104038038 | 9/2014 |
| JP | 08214542 | 8/1996 |

\* cited by examiner

METHOD FOR REDUCING POWER
CONSUMPTION OF POWER SUPPLY,
POWER SUPPLY AUTOMATICALLY
REDUCING POWER CONSUMPTION, AND
TELEVISION

CROSS REFERENCE TO RELATED
APPLICATIONS

This application is a continuation of International Application No. PCT/CN2017/073553, filed on Feb. 15, 2017, which claims priority to Chinese patent application No. 201610889826.7 filed on Oct. 11, 2016, contents of both of which are incorporated herein by reference in their entireties.

TECHNICAL FIELD

The present disclosure relates to techniques for reducing power consumption and, in particular, to a method for reducing power consumption of a power supply, a power supply capable of automatically reducing power consumption, and a television.

BACKGROUND

With the development of society, the awareness of energy conservation has been increasingly valued by a wide range of consumers. Power supplies of many power consumers, such as televisions, computers, air conditioners and refrigerators, have higher standby power consumption. It is reported that electric energy lost due to the standby power consumption of the electric equipment costs nearly 100 million yuan every year. Currently, a standby circuit of "intermittent operation mode" or a circuit with a zero-power consumption standby mode is generally used to reduce the power consumption of the electric equipment in the standby state. However, the "intermittent operation mode" in the related art requires the use of circuits such as relays, CPU control, supercapacitors, and large-capacity capacitors, and has disadvantages such as high cost, complicated circuit, poor safety control, and short life of the relay switch. Although the power consumption of the circuit with the zero-power consumption standby mode is reduced to near zero, the circuit with the zero-power standby mode can hardly make the standby indicator, infrared receiver and other devices work normally when being equipped to a whole machine. The user experience of these two circuits is poor.

SUMMARY

The present disclosure provides a method for reducing the power consumption of a power supply, a power supply automatically reducing power consumption, and a television, which can effectively reduce the standby power consumption of the electric equipment, save electric energy and improve the user experience.

In order to achieve the above-mentioned design, the present disclosure provides the solutions described below.

In a first aspect, a method for reducing the power consumption of a power supply is provided, which includes:

operating a voltage sampling circuit to acquire a voltage of an output capacitor;

if the acquired voltage is a first preset voltage, operating an optocoupler feedback circuit to receive the first preset voltage and output a second level; operating a deep standby control circuit to receive the second level and control a power supply management circuit to start working; and operating the power supply management circuit to receive the second level, output a corresponding constant voltage according to the second level and charge the output capacitor; and if the acquired voltage is a second preset voltage, operating the optocoupler feedback circuit to receive the second preset voltage and output a first level; operating the power supply management circuit to receive the first level and output a corresponding constant voltage according to the first level; and operating the deep standby control circuit to receive the first level and control, after a turn-off time, the power supply management circuit to stop working and operating the output capacitor to power a load.

The first preset voltage is less than the second preset voltage, and the first level is less than the second level.

Optionally, the operating a deep standby control circuit to receive the second level and control a power supply management circuit to start working includes:

operating a trigger switch of the deep standby control circuit to receive the second level, controlling a timing capacitor of the deep standby control circuit to enter a discharge state, and controlling an enable switch of the deep standby control circuit to make the power supply management circuit to start working when an instantaneous discharge of the timing capacitor is completed.

The operating the deep standby control circuit to receive the first level and control, after a turn-off time, the power supply management circuit to stop working includes:

operating the trigger switch to receive the first level, controlling the timing capacitor to enter a charging state, and controlling the enable switch to make the power supply management circuit stop working when a charging of the timing capacitor is completed.

Optionally, after operating the voltage sampling circuit to acquire a voltage of an output capacitor, the method further includes:

if the acquired voltage is the first preset voltage, operating the optocoupler feedback circuit to receive the first preset voltage and output the second level; operating the deep standby control circuit to receive the second level and control the power supply management circuit to start working; and operating the power supply management circuit to receive the second level, output the corresponding constant voltage according to the second level and power the load.

In a second aspect, a power supply automatically reducing its power consumption is provided, which includes: a voltage sampling circuit, an optocoupler feedback circuit, a deep standby control circuit, a power supply management circuit and an output rectifier filter. The output rectifier filter comprises an output capacitor.

The voltage sampling circuit is configured to acquire a voltage of the output capacitor.

If the acquired voltage is a first preset voltage, the optocoupler feedback circuit is configured to receive a first preset voltage and output a second level; the deep standby control circuit is configured to receive the second level and control the power supply management circuit to start working; and the power supply management circuit is configured to receive the second level, output a corresponding constant voltage according to the second level and charge the output capacitor.

If the acquired voltage is a second preset voltage, the optocoupler feedback circuit is configured to receive the second preset voltage and output a first level; the power supply management circuit is configured to receive the first level and output a corresponding constant voltage according to the first level; and the deep standby control circuit is further configured to receive the first level and control, after a turn-off time, the power supply management circuit to stop working and a load is powered by the output capacitor.

Optionally, the deep standby control circuit comprises a trigger switch, a timing capacitor, a power supply winding and an enable switch.

An input terminal of the trigger switch is connected to an output terminal of the optocoupler feedback circuit, and an output terminal of the trigger switch and an output terminal of the power supply winding are connected to an input terminal of the timing capacitor, an output terminal of the timing capacitor is connected to an input terminal of the enable switch, and an output terminal of the enable switch is connected to an input terminal of the power supply management circuit; where the input terminal of the trigger switch is used as an input terminal of the deep standby control circuit and the output terminal of the enable switch is used as an output terminal of the deep standby control circuit.

When the trigger switch of the deep standby control circuit receives the second level, the timing capacitor of the deep standby control circuit is controlled to enter a discharge state, and when an instantaneous discharge of the timing capacitor is completed, the enable switch of the deep standby control circuit is controlled to make the power supply management circuit start working.

When the trigger switch receives the first level, the timing capacitor is controlled to enter a charging state, and when a charging of the timing capacitor is completed, the enable switch is controlled to make the power supply management circuit stop working.

Optionally, the power supply further includes an electromagnetic interference (EMI) filter, a rectifier filter, a transformer and a switch tube.

An input terminal of the EMI filter is connected to the power supply, an output terminal of the EMI filter is connected to an input terminal of the rectifier filter, an input terminal of the switch tube is connected to an output terminal of the power supply management circuit, an output terminal of the switch tube and an output terminal of the rectifier filter are connected to an input terminal of the transformer, an output terminal of the transformer is connected to an input terminal of the output rectifier filter, and an output terminal of the output rectifier filter is connected to the load.

Optionally, the deep standby control circuit includes: a first resistor, a second resistor, a third resistor, a fourth resistor, a first triode, a second triode, a voltage regulator tube, a first capacitor and a second capacitor. The first triode and the second triode are NPN triodes.

A first terminal of the third resistor is respectively connected to a first terminal of the second resistor and a first terminal of the first capacitor, a second terminal of the second resistor is used as an input terminal of the deep standby control circuit, a second terminal of the third resistor is connected to a base of the first triode, a collector of the first triode is respectively connected to a first terminal of the first resistor, a first terminal of the fourth resistor, a first terminal of the second capacitor and a base of the second triode, a second terminal of the first resistor is connected to a positive electrode of the voltage regulator tube, a negative electrode of the voltage regulator tube is connected to a first voltage supply terminal, a collector of the second triode is used as an output terminal of the deep standby control circuit, a second terminal of the first capacitor, an emitter of the first triode, a second terminal of the fourth resistor, a second terminal of the second capacitor, and an emitter of the second triode are grounded.

Optionally, the voltage sampling circuit includes a first sampling resistor and a second sampling resistor, and the optocoupler feedback circuit includes: a fifth resistor, a sixth resistor, a third capacitor, a voltage regulator adjuster and a four-pin optocoupler.

A first pin of the voltage regulator adjuster is respectively connected to a first terminal of the first sampling resistor, a first terminal of the second sampling resistor and a first terminal of the third capacitor, a second terminal of the third capacitor is connected to a first terminal of the fifth resistor, a second terminal of the second sampling resistor is connected to a second voltage supply terminal, a second terminal of the fifth resistor is respectively connected to a second pin of the voltage regulator adjuster and a second pin of the four-pin optocoupler, a first pin of the four-pin optocoupler is connected to a first terminal of the sixth resistor, a second terminal of the sixth resistor is connected to the second voltage supply terminal, a fourth pin of the four-pin optocoupler is connected to a first voltage supply terminal, a third pin of the four-pin optocoupler is used as the output terminal of the optocoupler feedback circuit and connected to the input terminal of the deep standby control circuit, and a second terminal of the first sampling resistor and a third pin of the voltage regulator adjuster are grounded.

Optionally, the power supply management circuit includes a power supply management chip, a polar capacitor, a first diode and a seventh resistor; the switch tube comprises a metal oxide semiconductor field effect transistor (MOSFET), which is an N-channel enhanced MOSFET, and the rectifier filter includes a rectifier bridge; and the transformer comprises an eight-pin transformer.

A fourth pin of the power supply management chip is respectively connected to the output terminal of the optocoupler feedback circuit and the input terminal of the deep standby control circuit, a fifth pin of the power supply management chip is connected to the output terminal of the deep standby control circuit, a seventh pin of the power supply management chip is respectively connected to a source of the MOSFET and a first terminal of the seventh resistor, a drain of the MOSFET is connected to a third pin of the transformer, a first pin of the transformer is connected to a first pin of the rectifier bridge, a second pin and a third pin of the rectifier bridge are connected to the output terminal of the EMI filter, the input terminal of the EMI filter is connected to an alternating current (AC) power socket, a fifth pin of the transformer is connected to a positive electrode of the first diode, a negative electrode of the first diode is respectively connected to a tenth pin of the power supply management chip, the first voltage supply terminal and a positive electrode of the polar capacitor, an eighth pin of the transformer is connected to the input terminal of the output rectifier filter, and a sixth pin of the transformer, a seventh pin of the transformer, a second terminal of the seventh resistor, a negative electrode of the polar capacitor, an eighth pin of the power supply management chip and a fourth pin of the rectifier bridge are grounded.

Optionally, the output rectifier filter includes second diode and an output capacitor. A positive electrode of the second diode is used as an input terminal of the output rectifier filter, a negative electrode of the second diode is respectively connected to a positive electrode and a negative electrode of the output capacitor, and the negative electrode of the output capacitor is grounded.

In a third aspect, a television is provided, which includes a power supply automatically reducing its power consumption.

The power supply automatically reducing its power consumption includes a voltage sampling circuit, an optocoupler feedback circuit, a deep standby control circuit, a power supply management circuit and an output rectifier filter. The output rectifier filter includes an output capacitor.

The voltage sampling circuit acquires a voltage of the output capacitor;

If the acquired voltage is a first preset voltage, the optocoupler feedback circuit is configured to receive the first preset voltage and output a second level, the deep standby control circuit is configured to receive the second level and control the power supply management circuit to start working; and the power supply management circuit is configured to receive the second level, output a corresponding constant voltage according to the second level and charge the output capacitor.

If the acquired voltage is a second preset voltage, the optocoupler feedback circuit is further configured to receive the second preset voltage and output a first level; the power supply management circuit is configured to receive the first level and output a corresponding constant voltage according to the first level; and the deep standby control circuit is further configured to receive the first level and control, after a turn-off time, the power supply management circuit to stop working and a load is powered by the output capacitor.

Optionally, the deep standby control circuit includes a trigger switch, a timing capacitor, a power supply winding and an enable switch.

An input terminal of the trigger switch is connected to an output terminal of the optocoupler feedback circuit, an output terminal of the trigger switch and an output terminal of the power supply winding are connected to an input terminal of the timing capacitor, an output terminal of the timing capacitor is connected to an input terminal of the enable switch, and an output terminal of the enable switch is connected to an input terminal of the power supply management circuit, where the input terminal of the trigger switch is used as an input terminal of the deep standby control circuit, and the output terminal of the enable switch is used as an output terminal of the deep standby control circuit.

When the trigger switch of the deep standby control circuit receives the second level, the timing capacitor of the deep standby control circuit is controlled to enter a discharge state, and when an instantaneous discharge of the timing capacitor is completed, the enable switch of the deep standby control circuit is controlled to make the power supply management circuit start working.

When the trigger switch receives the first level, the timing capacitor is controlled to enter a charging state, and when a charging of the timing capacitor is completed, the enable switch is controlled to make the power supply management circuit stop working.

Optionally, the power supply further includes an electromagnetic interference (EMI) filter, a rectifier filter, a transformer and a switch tube.

An input terminal of the EMI filter is connected to the power supply, an output terminal of the EMI filter is connected to an input terminal of the rectifier filter, an input terminal of the switch tube is connected to an output terminal of the power supply management circuit, an output terminal of the switch tube and an output terminal of the rectifier filter are connected to an input terminal of the transformer, an output terminal of the transformer is connected to an input terminal of the output rectifier filter, and an output terminal of the rectifier filter is connected to a load.

Optionally, the deep standby control circuit includes: a first resistor, a second resistor, a third resistor, a fourth resistor, a first triode, a second triode, a voltage regulator tube, a first capacitor and a second capacitor. where the first triode and the second triode are NPN type triode.

A first terminal of the third resistor is respectively connected to a first terminal of the second resistor and a first terminal of the first capacitor, a second terminal of the second resistor is used as an input terminal of the deep standby control circuit, a second terminal of the third resistor is connected to a base of the first triode, a collector of the first triode is respectively connected to a first terminal of the first resistor, a first terminal of the fourth resistor, a first terminal of the second capacitor and a base of the second triode, a second terminal of the first resistor is connected to a positive electrode of the voltage regulator tube, a negative electrode of the voltage regulator tube is connected to a first voltage supply terminal, a collector of the second triode is used as an output terminal of the deep standby control circuit, a second terminal of the first capacitor, an emitter of the first triode, a second terminal of the fourth resistor, a second terminal of the second capacitor and an emitter of the second triode are grounded.

Optionally, the voltage sampling circuit includes a first sampling resistor and a second sampling resistor, and the optocoupler feedback circuit includes: a fifth resistor, a sixth resistor, a third capacitor, a voltage regulator adjuster and a four-pin optocoupler.

A first pin of the voltage regulator adjuster is respectively connected to a first terminal of the first sampling resistor, a first terminal of the second sampling resistor and a first terminal of the third capacitor, a second terminal of the third capacitor is connected to a first terminal of the fifth resistor, a second terminal of the second sampling resistor is connected to a second voltage supply terminal, a second terminal of the fifth resistor is respectively connected to a second pin of the voltage regulator adjuster and a second pin of the four-pin optocoupler, a first pin of the four-pin optocoupler is connected to a first terminal of the sixth resistor, a second terminal of the sixth resistor is connected to the second voltage supply terminal, a fourth pin of the four-pin optocoupler is connected to a first voltage supply terminal, a third pin of the four-pin optocoupler is used as the output terminal of the optocoupler feedback circuit and connected to the input terminal of the deep standby control circuit, and a second terminal of the first sampling resistor and a third pin of the voltage regulator adjuster are both grounded.

In the embodiments of the present disclosure, the voltage sampling circuit acquires the voltage of the output capacitor. If the acquired voltage is the first preset voltage, the optocoupler feedback circuit receives the first preset voltage and outputs the second level, the deep standby control circuit receives the second level and controls the power supply management circuit to start working, and the power supply management circuit receives the second level, outputs the corresponding constant voltage according to the second level and charges the output capacitor. If the acquired voltage is the second preset voltage, the optocoupler feedback circuit receives the second preset voltage and outputs the first level, the power supply management circuit receives the first level and outputs the corresponding constant voltage according to the first level, the deep standby control circuit receives the first level and controls, after a turn-off time, the power supply management circuit to stop working and the load is powered by the output capacitor. The feedback amount (the second level or the first level) of the optocoupler feedback circuit changes as the capacity of the output capacitor changes, controlling the power supply management circuit to intermittently enter a deep sleep mode while achieving a constant voltage output; and effectively reducing the standby power consumption of the electric equipment, thereby saving electric energy and improving the user experience.

BRIEF DESCRIPTION OF DRAWINGS

To illustrate the technical solutions in the embodiments of the present disclosure more clearly, the accompanying drawings used in the embodiments will be described below, and the accompanying drawings described below illustrate part of embodiments of the present disclosure.

DETAILED DESCRIPTION

Solutions in embodiments of the present disclosure will be described in detail in conjunction with the accompanying drawings. The embodiments described below are part of embodiments of the present disclosure.

Embodiment 1

Figure 1:
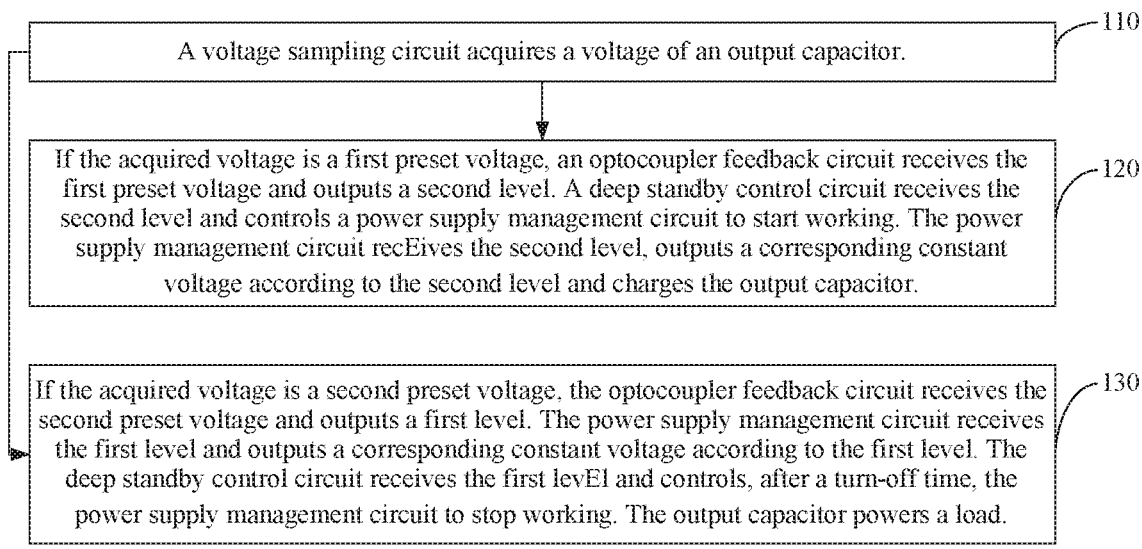
FIG. 1 is a flowchart of a method of a first embodiment of a method for reducing the power consumption of a power supply according to an optional embodiment of the present disclosure.

FIG. 1 is a flowchart of a method of a first embodiment of a method for reducing the power consumption of a power supply according to an optional embodiment of the present disclosure; As shown in FIG. 1, the method includes steps 110, 120 and 130.

In step 110, a voltage sampling circuit acquires a voltage of an output capacitor.

In step 120, If the acquired voltage is a first preset voltage, an optocoupler feedback circuit receives the first preset voltage and outputs a second level, and a deep standby control circuit receives the second level and controls a power supply management circuit to start working. The power supply management circuit receives the second level, outputs a corresponding constant voltage according to the second level and charges the output capacitor.

The first preset voltage is less than the second preset voltage, and the first level is less than the second level.

Optionally, the voltage values of the first preset voltage and the second preset voltage may be determined according to a load. Exemplarily, the voltage value of the preset first voltage is in a range of 7.5 V to 8.5 V, and the voltage value of the preset second voltage is in a range of 11.8 V to 12.5 V. Exemplarily, when the voltage of the capacitor is insufficient to provide a constant voltage for the load, the voltage sampling circuit acquires the first preset voltage, and the optocoupler feedback circuit receives the first preset voltage and outputs the corresponding second level after the first preset voltage is processed. The second level, first as a deep standby control signal, causes the power supply management circuit to exit a deep sleep mode and start working after processed by the deep standby control circuit, and then as a voltage regulation feedback signal, controls the power supply management circuit to output a constant voltage, enables the power supply management circuit to enter a frequency hopping mode and controls a switch tube to operate in a low frequency state to charge the output capacitor. The low frequency state is a state in which the frequency is lower than 1 kilohertz (kHz), and usually several hundred hertz.

In step 130, if the acquired voltage is the second preset voltage, the optocoupler feedback circuit receives the second preset voltage and outputs the first level. The power supply management circuit receives the first level and outputs a corresponding constant voltage according to the first level. The deep standby control circuit receives the first level and controls, after a turn-off time, the power supply management circuit to stop working, and the load is powered by the output capacitor.

The optocoupler feedback circuit receives the second preset voltage and outputs the first level after processing the second preset level. The first level, first as a voltage regulation feedback signal, controls the power supply management circuit and enables the power supply management circuit to output the constant voltage and enter the frequency hopping mode, thereby controlling the switch tube to operate in a low frequency state with 25 kHz and reducing the consumption of the switch tube. Then, the first level, as a deep standby control signal, causes the power supply management circuit to exit a working mode after processed by the deep standby control circuit, i.e., to make the power supply management circuit enter the deep sleep mode. At this point, the load is powered by charges stored by the output capacitor.

The first preset voltage or the second preset voltage is the voltage of the output capacitor when the load is a light load. The second preset voltage may be a voltage range. When the voltage of the output capacitor is in the range of the second preset voltage, a constant voltage output can be achieved by solely relying on the power supplied by the output capacitor. At this time, the power supply management circuit automatically enters the deep sleep mode, which greatly reduces the power consumption during standby. The first preset voltage may also be a voltage range and when the voltage of the output capacitor is in the range of the first preset voltage, the constant voltage output cannot be achieved by solely relying on the power supplied by the output capacitor. The second preset voltage is greater than the first preset voltage. Optionally, the light load is a load under the standby state of the electric equipment and the load rate does not exceed 1%. For example, the light load is an indicator light and the load rate is 0.1%.

In step 120, the output capacitor is charged, after a charge amount of the output capacitor exceeds a predetermined value (i.e., the power solely supplied by the output capacitor can achieve the constant voltage output), step 110 is executed. The voltage of the output capacitor acquired by the voltage sampling circuit is the second preset voltage, and step 130 is then executed to control the power supply management circuit to stop working. In step 130, the output capacitor supplies power to the load and the charge amount of the output capacitor is reduced. When the power solely supplied by the output capacitor cannot achieve the constant voltage output, step 110 is executed, the voltage of the output capacitor acquired by the voltage sampling circuit is a preset lower voltage, and step 120 is then executed to control the power supply management circuit to start working and charge the output capacitor. After that, these operations repeat in the similar way.

The sequence of step 120 and step 130 are not limited, and the step 120 and step 130 are optional steps equal in status. When the acquired voltage is the first preset voltage, step 120 is executed and step 130 is not executed; and when the acquired voltage is the second preset voltage, step 130 is executed and step 120 is not executed.

In conclusion, in the embodiments of the present disclosure, the voltage sampling circuit acquires the voltage of the output capacitor. When the acquired voltage is the first preset voltage, the optocoupler feedback circuit receives the first preset voltage and outputs the second level, the deep standby control circuit receives the second level and controls the power supply management circuit to start working, and the power supply management circuit receives the second level, outputs the corresponding constant voltage according to the second level and charges the output capacitor. When the acquired voltage is the second preset voltage, the optocoupler feedback circuit receives the second preset voltage and outputs the first level, the power supply management circuit receives the first level and outputs the corresponding constant voltage according to the first level, the deep standby control circuit receives the first level and controls, after a turn-off time, the power supply management circuit to stop working and the load is powered by the output capacitor. The feedback amount (the second level or the first level) of the optocoupler feedback circuit changes as the charge amount of the output capacitor changes, the working state of the power supply management circuit is effectively controlled, the power supply management circuit is controlled to intermittently enter a deep sleep mode when a constant voltage output is achieved, thereby effectively reducing the standby power consumption of the electric equipment and saving electric energy and improving the user experience.

Embodiment 2

Figure 2:
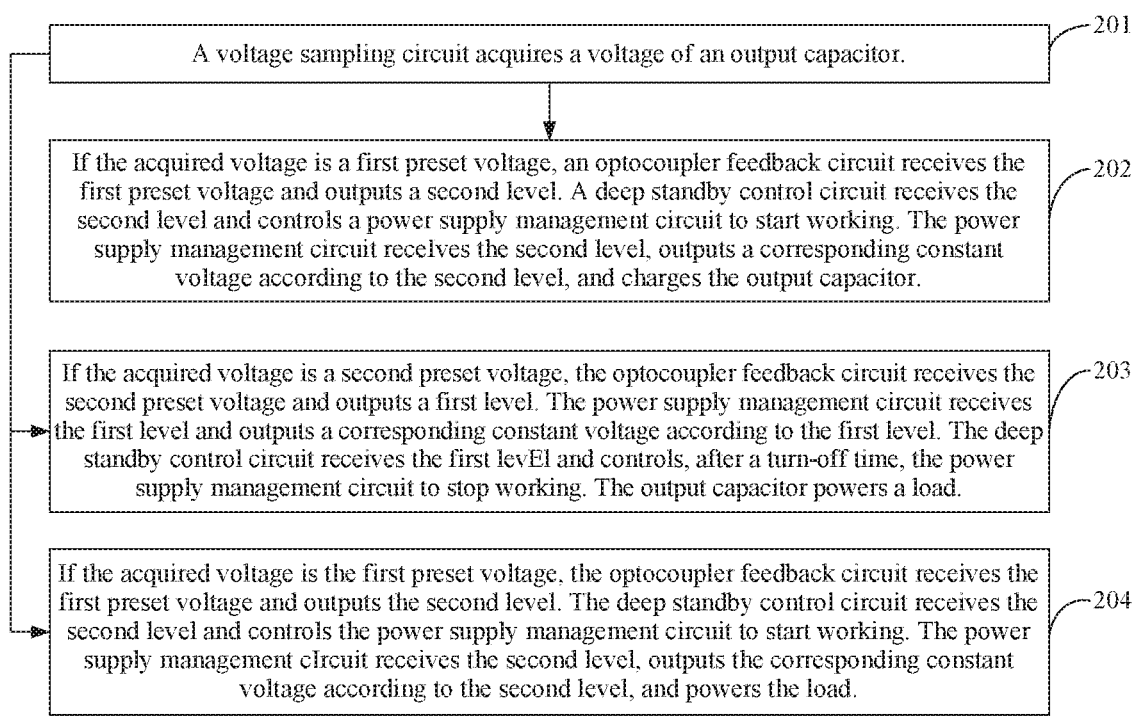
FIG. 2 is a flowchart of a method of a second embodiment of a method for reducing the power consumption of a power supply according to an optional embodiment of the present disclosure.

With reference to FIG. 2, FIG. 2 is a flowchart of a method of a second embodiment of a method for reducing the power consumption of a power supply according to an optional embodiment of the present disclosure. As shown in FIG. 2, the method includes steps 201, 202, 203 and 204.

In step 201, a voltage sampling circuit detects a voltage of an output capacitor.

In step 202, If the detected voltage is a first preset voltage, an optocoupler feedback circuit receives the first preset voltage and outputs a second level. A deep standby control circuit receives the second level and controls a power supply management circuit to start working. The power supply management circuit receives the second level, outputs a corresponding constant voltage according to the second level and charges the output capacitor.

The process in which the deep standby control circuit receives the second level and controls the power supply management circuit to start working is as follows. A trigger switch of the deep standby control circuit receives the second level, a timing capacitor of the deep standby control circuit is controlled to enter a discharge state, and an enable switch of the deep standby control circuit causes the power supply management circuit to start working when an instantaneous discharge of the timing capacitor is completed.

In step 203, if the detected voltage is a second preset voltage, the optocoupler feedback circuit receives the second preset voltage and outputs the first level. The power supply management circuit receives the first level and outputs a corresponding constant voltage according to the first level. The deep standby control circuit receives the first level and controls, after a turn-off time, the power supply management circuit to stop working, and a load is powered by the output capacitor.

The process in which the deep standby control circuit receives the first level and controls, after a turn-off time, the power supply management circuit to stop working is as follows. The trigger switch receives the first level, controls the timing capacitor to enter a charging state, and controls the enable switch to cause the power supply management circuit to stop working when a charging of the timing capacitor is completed.

In step 202, the output capacitor is charged. After the charge amount of the output capacitor exceeds a predetermined value (i.e., the constant voltage output can be achieved by the power solely supplied by the output capacitor), step 201 is executed. The voltage of the output capacitor detected by the voltage sampling circuit is the second preset voltage, and then step 203 is executed to control the power supply management circuit to stop working. In step 203, the output capacitor supplies power to the load and the charge amount of the output capacitor is reduced. When the power solely supplied by the output capacitor cannot achieve the constant voltage output, step 201 is executed. The voltage of the output capacitor detected by the voltage sampling circuit is the first preset voltage, and then step 202 is executed to control the power supply management circuit to start working and charge the output capacitor. After that, these operations repeat in the similar way. When the voltage detected in step 201 is the first preset voltage (i.e., the load is a heavy load), step 204 is executed.

In step 204, when the detected voltage is the first preset voltage, the optocoupler feedback circuit receives the first preset voltage and outputs the second level; the deep standby control circuit receives the second level and controls the power supply management circuit to start working; and the power supply management circuit receives the second level, outputs the corresponding constant voltage according to the second level to supply power to the load.

When the output load is the heavy load, the voltage sampling circuit acquires the second preset voltage, and the optocoupler feedback circuit processes the second preset voltage and generates the first level. The first level, first as a voltage regulation feedback signal, controls the power supply management circuit to output the constant voltage, causes the power supply management circuit to exit a frequency hopping mode and controls a switch tube to operate in a high frequency state. The transformer works and outputs normally. output. Then the first level, as a deep standby control signal, causes the power supply management circuit to exit a deep sleep mode after being processed by the deep standby control circuit. That is, the power supply management circuit starts working and outputs a voltage to power the load. The heavy load is a load whose load rate is more than 80%.

The executions of step 202, step 203 and step 204 are not limited by the sequence and step 202, step 203 and step 204 are optional steps in parallel. If the acquired voltage is the first preset voltage, step 202 is executed and step 203 and step 204 are not executed; if the acquired voltage is the second preset voltage, step 203 is executed and step 202 and step 204 are not executed; and if the acquired voltage is the first preset voltage, step 204 is executed and step 202 and step 203 are not executed.

In conclusion, in the present embodiment, if the acquired voltage is the first preset voltage, the optocoupler feedback circuit receives the first preset voltage and outputs the second level; the deep standby control circuit receives the second level and controls the power supply management circuit to start working; and the power supply management circuit receives the second level, outputs the corresponding constant voltage according to the second level and powers the load. This method achieves the efficient switching between the light load control and the heavy load control while achieving a constant voltage output. When the load is the light load, the power supply management circuit is controlled to intermittently enter a deep sleep mode, the power consumption of the electric equipment during standby is effectively reduced, thereby saving electric energy and improving the user experience.

Embodiment 3

The solution of a power supply capable of automatically reducing power consumption of the present disclosure is described hereinafter through optional embodiments with reference to FIGS. 3 to 5.

Figure 3:
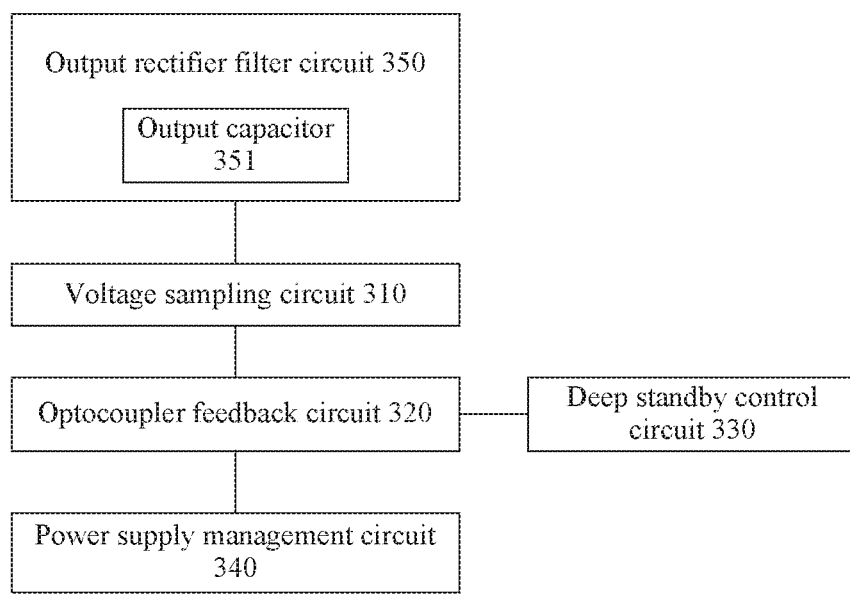
FIG. 3 is a structural diagram of a power supply automatically reducing power consumption according to an optional embodiment of the present disclosure.

FIG. 3 is a structural diagram of a power supply capable of automatically reducing power consumption according to an optional embodiment of the present disclosure. As shown in FIG. 3, a power supply capable of automatically reducing power consumption includes: a voltage sampling circuit 310, an optocoupler feedback circuit 320, a deep standby control circuit 330, a power supply management circuit 340 and an output rectifier filter 350. The output rectifier filter 350 includes an output capacitor 351.

The voltage sampling circuit 350 detects a voltage of the output capacitor 351. If the detected voltage is a first preset voltage, the optocoupler feedback circuit 320 receives the first preset voltage and outputs a second level. The deep standby control circuit 330 receives the second level and controls the power supply management circuit 340 to start working. The power supply management circuit 340 receives the second level, outputs a corresponding constant voltage according to the second level and charges the output capacitor 351. If the detected voltage is a second preset voltage, the optocoupler feedback circuit 320 receives the second preset voltage and outputs the first level. The power supply management circuit 340 receives the first level and outputs a corresponding constant voltage according to the first level. The deep standby control circuit 330 receives the first level and controls, after a turn-off time, the power supply management circuit 340 to stop working, and a load is powered by the output capacitor 351.

If the voltage of the capacitor is insufficient to provide a constant voltage for the load, the voltage sampling circuit detects the first preset voltage, and the optocoupler feedback circuit 320 receives the first preset voltage and outputs the corresponding second level after the first preset voltage is processed. The second level, first as a deep standby control signal, causes the power supply management circuit 340 to exit a deep sleep mode and start working after being processed by the deep standby control circuit 330. Then, the first preset voltage, as a voltage regulation feedback signal, controls the power supply management circuit 340 to output a constant voltage, causes the power supply management circuit 340 to enter a frequency hopping mode and controls a switch tube to operate in a low frequency state to charge the output capacitor 351. The low frequency state is a state in which the frequency is lower than 1 kilohertz (kHz), and usually several hundred hertz.

The optocoupler feedback circuit 320 receives the second preset voltage, processes the second preset voltage, and then outputs the first level. The first level, first as a voltage regulation feedback signal, controls the power supply management circuit 340 and causes the power supply management circuit 340 to output the constant voltage and enter the frequency hopping mode, thereby controlling the switch tube to operate in a low frequency state with 25 kHz and reducing the consumption of the switch tube. Then, the first level, as a deep standby control signal, is processed by the deep standby control circuit 330 and then causes the power supply management circuit 340 stop working. That is, the power supply management circuit 340 enters the deep sleep mode. At this point, the load is powered by charges stored by the output capacitor 351.

The first preset voltage or the second preset voltage is the voltage of the output capacitor when the load is a light load. The second preset voltage may be a voltage range and when the voltage of the output capacitor 351 is in the range of the second preset voltage, a constant voltage output can be achieved by relying on the power solely supplied by the output capacitor 351. At this time, the power supply management circuit 340 automatically enters the deep sleep mode, which greatly reduces the standby power consumption. The first preset voltage may also be a voltage range and when the voltage of the output capacitor 351 is in the range of the first preset voltage, the constant voltage output cannot be achieved by relying on the power solely supplied by the output capacitor 351. The second preset voltage is greater than the first preset voltage. Optionally, the light load is a load under the standby state of the electric equipment and the load rate does not exceed 1%. For example, the light load is an indicator light and the load rate is 0.1%.

The output capacitor 351 is charged. When a charge amount of the output capacitor 351 exceeds a predetermined value (i.e., the power solely supplied by the output capacitor 351 with such charge amount can achieve the constant voltage output), the voltage of the output capacitor 351 detected by the voltage sampling circuit is the second preset voltage, and the power supply management circuit 340 is controlled to stop working. When the output capacitor 351 supplies power to the load, the charge amount of the output capacitor 351 is reduced. If the power solely supplied by the output capacitor 351 cannot achieve the constant voltage output, the voltage of the output capacitor 351 detected by the voltage sampling circuit is the first preset voltage, and the power supply management circuit 340 is controlled to start working and charge the output capacitor 351. After that, these operations are repeated in the similar way.

In the present embodiment, the feedback amount (the second level or the first level) of the optocoupler feedback circuit 320 changes as the charge amount of the output capacitor 351 changes, the working state of the power supply management circuit 340 is effectively controlled, the power supply management circuit 340 is controlled to intermittently enter a deep sleep mode while achieving a constant voltage output, thereby effectively reducing the standby power consumption of the electric equipment and saving electric energy and improving the user experience.

Figure 4:
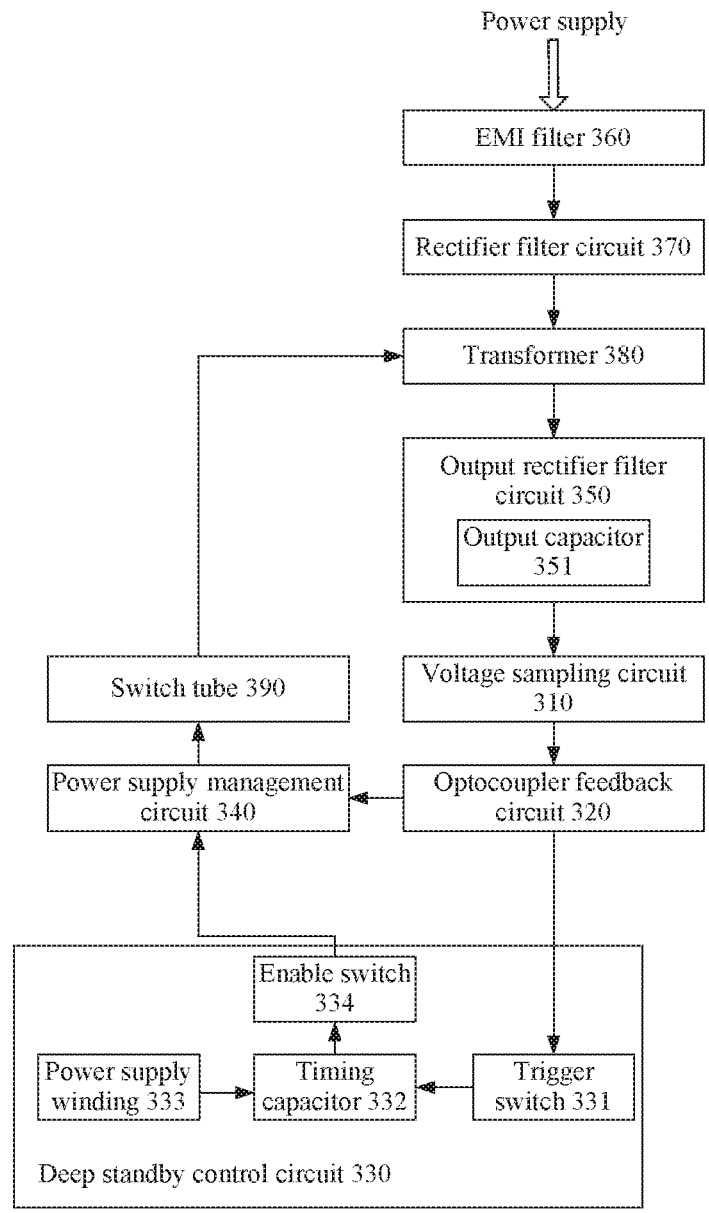
FIG. 4 is another structural diagram of a power supply automatically reducing power consumption according to an optional embodiment of the present disclosure.

FIG. 4 is another structural diagram of a power supply capable of automatically reducing power consumption according to an optional embodiment of the present disclosure. With reference to FIG. 4, the deep standby control circuit 330 includes a trigger switch 331, a timing capacitor 332, a power supply winding 333 and an enable switch 340.

An input terminal of the trigger switch 331 is connected to an output terminal of the optocoupler feedback circuit 320. An output terminal of the trigger switch 331 and an output terminal of the power supply winding 333 are connected to an input terminal of the timing capacitor 332. An output terminal of the timing capacitor 332 is connected to an input terminal of the enable switch 334. An output terminal of the enable switch 334 is connected to an input terminal of the power supply management circuit 340. The input terminal of the trigger switch 331 is used as an input terminal of the deep standby control circuit 330 and the output terminal of the enable switch 334 is used as an output terminal of the deep standby control circuit 330.

When the trigger switch 331 of the deep standby control circuit 330 receives the second level, the timing capacitor 332 of the deep standby control circuit 330 is controlled to enter a discharge state. When an instantaneous discharge of the timing capacitor 332 is completed, the enable switch 334 of the deep standby control circuit 330 is controlled to cause the power supply management circuit 340 to start working.

When the trigger switch 331 receives the first level, the timing capacitor 332 is controlled to enter a charging state, and when a charging of the timing capacitor 332 is completed, the enable switch 334 is controlled to cause the power supply management circuit 340 to stop working.

The power supply further includes an electromagnetic interference (EMI) filter 360, a rectifier filter 370, a transformer 380 and a switch tube 390.

An input terminal of the EMI filter 360 is connected to the power supply. An output terminal of the EMI filter 360 is connected to an input terminal of the rectifier filter 370. An input terminal of the switch tube 390 is connected to an output terminal of the power supply management circuit 340. An output terminal of the switch tube 390 and an output terminal of the rectifier filter 370 are connected to an input terminal of the transformer 380. An output terminal of the transformer 380 is connected to an input terminal of the output rectifier filter 350. An output terminal of the rectifier filter 370 is connected to the load.

In the present embodiment, in addition to achieving a constant voltage output, this method achieves the efficient switching between the light load control and the heavy load control. When the load is the light load, the power supply management circuit intermittently enters a deep sleep mode, thereby effectively reducing the standby power consumption of the electric equipment, saving electric energy and improving the user experience.

Figure 5:
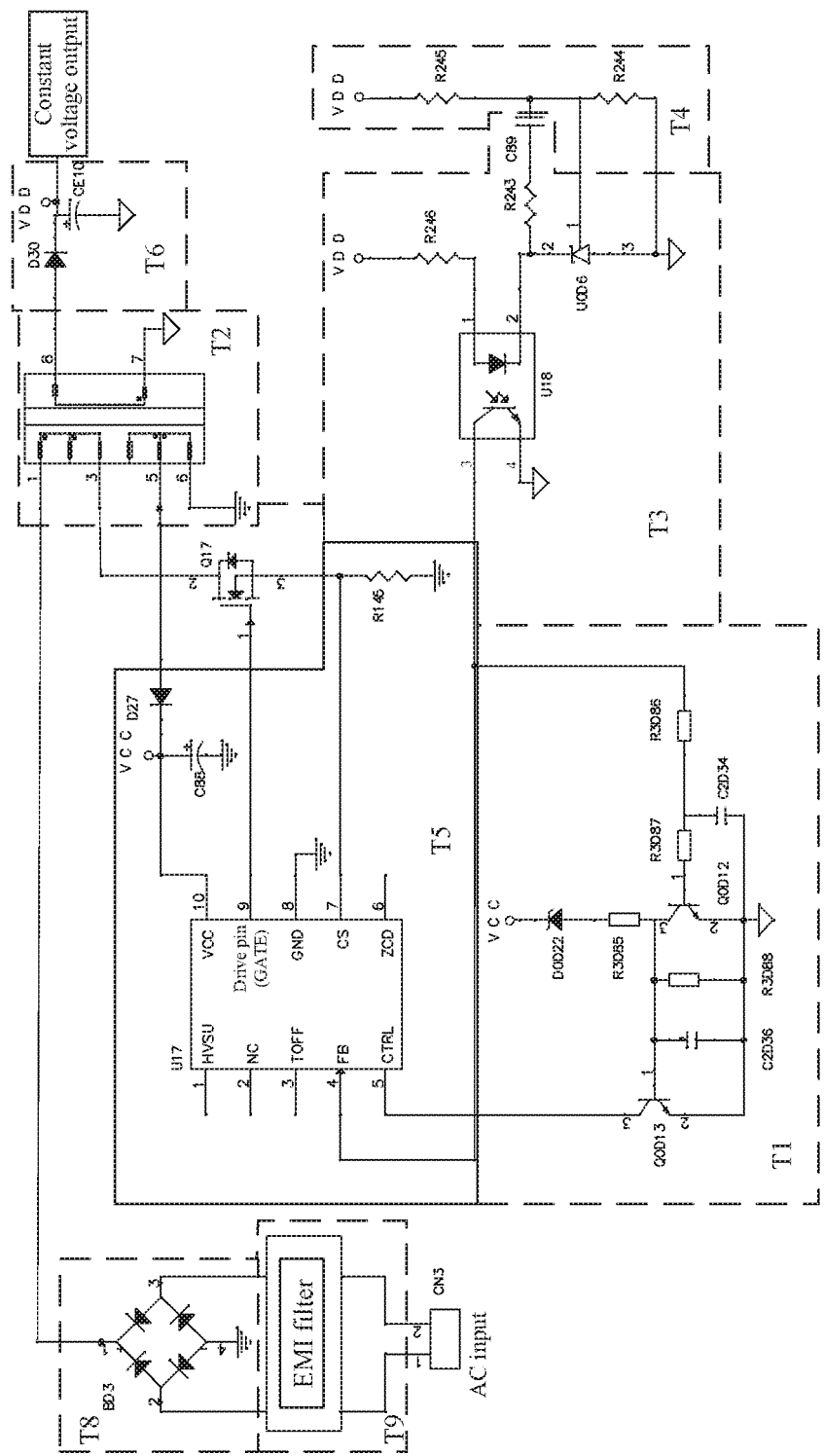
FIG. 5 is a schematic diagram of a circuit of a power supply automatically reducing power consumption according to an optional embodiment of the present disclosure.

FIG. 5 is a schematic diagram of a circuit of a power supply capable of automatically reducing power consumption according to an optional embodiment of the present disclosure. With reference to FIG. 5, the deep standby control circuit T1 includes: a first resistor R3D85, a second resistor R3D86, a third resistor R3D87, a fourth resistor R3D88, a first triode Q0D12, a second triode Q0D13, a voltage regulator tube D0D22, a first capacitor C2D34 and a second capacitor C2D36. The first triode Q0D12 and the second triode Q0D13 are NPN type triodes.

A first terminal of the third resistor R3D87 is respectively connected to a first terminal of the second resistor R3D86 and a first terminal of the first capacitor C2D34. A second terminal of the second resistor R3D86 is used as an input terminal of the deep standby control circuit T1. A second terminal of the third resistor R3D87 is connected to a base of the first triode Q0D12. A collector of the first triode Q0D12 is respectively connected to a first terminal of the first resistor R3D85, a first terminal of the fourth resistor R3D88, a first terminal of the second capacitor C2D36 and a base of the second triode Q0D13. A second terminal of the first resistor R3D85 is connected to a positive electrode (anode) of the voltage regulator tube D0D22, and a negative electrode (cathode) of the voltage regulator tube D0D22 is connected to a first voltage supply terminal VVC. A collector of the second triode Q0D13 is used as an output terminal of the deep standby control circuit T1. A second terminal of the first capacitor C2D34, an emitter of the first triode Q0D12, a second terminal of the fourth resistor R3D88, a second terminal of the second capacitor C2D36 and an emitter of the second triode Q0D13 are grounded.

The voltage sampling circuit T4 includes a first sampling resistor R244 and a second sampling resistor R245. The optocoupler feedback circuit T3 includes: a fifth resistor R243, a sixth resistor R246, a third capacitor C89, a voltage regulator adjuster U0D6 and a four-pin optocoupler U18.

A first pin of the voltage regulator adjuster U0D6 is respectively connected to a first terminal of the first sampling resistor R244, a first terminal of the second sampling resistor R245 and the first terminal of the third capacitor C89. A second terminal of the third capacitor C89 is connected to a first terminal of the fifth resistor R243. A second terminal of the second sampling resistor R245 is connected to a second voltage supply terminal VDD. A second terminal of the fifth resistor R243 is respectively connected to a second pin of the voltage regulator adjuster U0D6 and a second pin of the four-pin optocoupler U18. A first pin of the four-pin optocoupler U18 is connected to a first terminal of the sixth resistor R246, and a second terminal of the sixth resistor R246 is connected to the terminal VDD. A fourth pin of the four-pin optocoupler U18 is connected to the terminal VCC. A third pin of the four-pin optocoupler U18 is used as an output terminal of the optocoupler feedback circuit T3 and connected to the input terminal of the deep standby control circuit T1. A second terminal of the first sampling resistor R244 and a third pin of the voltage regulator adjuster U0D6 are grounded.

The power supply management circuit T5 includes a power supply management chip U17, a polar capacitor C88, a first diode D27 and a seventh resistor R145. A model of the power supply management chip U17 may be HULED001A. The switch tube includes a metal oxide semiconductor field effect transistor (MOSFET) Q17, which is an N-channel enhanced MOSFET. The rectifier filter T8 includes a rectifier bridge BD3. The transformer includes an eight-pin transformer T2.

A fourth pin of the power supply management chip U17 is respectively connected to the output terminal of the optocoupler feedback circuit T3 and the input terminal of the deep standby control circuit T1. A fifth pin of the power supply management chip U17 is connected to an output terminal of the deep standby control circuit T1. A seventh pin of the power supply management chip U17 is respectively connected to a source of the MOSFET Q17 and a first terminal of the seventh resistor R145. A drain of the MOSFET Q17 is connected to a third pin of the eight-pin transformer T2. A first pin of the eight-pin transformer T2 is connected to a first pin of the BD3. A second pin and a third pin of the BD3 are connected to an output terminal of the EMI filter T9. An input terminal of the EMI filter T9 is connected to an alternating current (AC) power socket CN3. A fifth pin of the eight-pin transformer T2 is connected to a positive electrode of the first diode D27, and a negative electrode of the first diode D27 is respectively connected to a tenth pin of the power supply management chip U17, the terminal VCC and a positive electrode of the polar capacitor C88. An eighth pin of the eight-pin transformer T2 is connected to an input terminal of the output rectifier filter T6. A sixth pin of the eight-pin transformer T2, a seventh pin of the eight-pin transformer T2, a second terminal of the seventh resistor R145, a negative electrode of the polar capacitor C88, an eighth pin of the power supply management chip U17 and a fourth pin of the BD3 are grounded.

The terminal VCC is the tenth pin of the power supply management chip U17, and a voltage of the terminal VCC is a voltage of the tenth pin of the power supply management chip U17. The terminal VDD is a positive electrode of the output capacitor CE10 and a voltage of the terminal VDD is a voltage of the output capacitor CE10.

The output rectifier filter T6 includes a second diode D30 and an output capacitor CE10. A positive electrode of the second diode D30 is used as an input terminal of the output rectifier filter T6, and a negative electrode of the second diode D30 is respectively connected to a positive electrode of the output capacitor CE10 and the load. The negative electrode of the output capacitor CE10 is grounded.

When the electric-equipment is in a standby state or when an output load is a light load, the second sampling resistor R245 and the first sampling resistor R244 of the voltage sampling circuit T4 make up a voltage division sampling circuit, and the sampling voltage is high, which is inputted to the first pin of the voltage regulator adjuster U0D6. The current flowing through the first pin and the second pin of the four-pin optocoupler U18 is controlled to become higher by the voltage regulator adjuster U0D6 and then is fed back to the third pin and the fourth pin of a primary side of the four-pin optocoupler U18, so that the level of the third pin of the four-pin optocoupler U18 becomes lower. The third pin of the four-pin optocoupler U18 is connected to the fourth pin of the power supply management chip U17 and the deep standby control circuit T1. The level of the third pin of the four-pin optocoupler U18, first used as a voltage regulation feedback signal, controls the power supply management chip U17, then controls the switch tube Q17 (i.e., the MOSFET Q17) and then controls the eight-pin transformer T2 to output a smaller amount of electrical energy and maintain the constant output voltage. At the same time, the level of the third pin of the four-pin optocoupler U18 becomes lower, the fourth pin of the power supply management chip U17 causes the power supply management circuit T5 to enter a frequency hopping mode and causes the switch tube to work in a low frequency state with 25 kHz, thereby reducing the power consumption of the switch tube. Next, the level of the third pin of the four-pin optocoupler U18, as a deep standby control signal, is processed by a signal processing circuit of the deep standby control circuit T1, and then makes the power supply management chip U17 enter a deep sleep mode, i.e., the power supply management chip U17 stops working, and the load is powered by electric charges stored by the output capacitor CE10.

When the load is powered by electric charges stored on the output capacitor CE10, the voltage of the output capacitor CE10 decreases. When the voltage of the output capacitor CE10 is insufficient to provide a constant voltage for the load, the voltage is sampled by the voltage sampling circuit including the second sampling resistor R245 and the first sampling resistor R244, and the sampled voltage is low. The sampled voltage is inputted to the first pin of the voltage regulator adjuster U0D6. The current flowing through the first pin and the second pin of the four-pin optocoupler U18 is controlled to become lower by the voltage regulator adjuster U0D6 and is fed back to the third pin and the fourth pin of the primary side, so that the level of the third pin of the four-pin optocoupler U18 becomes higher. The third pin of the four-pin optocoupler U18 is connected to the fourth pin of the power supply management chip U17 and the deep standby control circuit T1. The level of the third pin of the four-pin optocoupler U18, first used as the deep standby control signal, is processed by the signal processing circuit of the deep standby control circuit T1, and then makes the fifth pin of the power supply management chip U17 become a high level and controls the power supply management chip U17 to exit the deep sleep mode, i.e., makes the power supply management chip U17 start working. Next, the level of the third pin of the four-pin optocoupler U18, used as the voltage regulator feedback signal, is sent to the fourth pin of the power supply management chip U17. The power supply management circuit T5 is controlled according to the level of the third pin of the four-pin optocoupler U18 to output a voltage of the required electrical energy, and the power supply management circuit T5 is maintained in the frequency hopping state, so that the switch tube Q17 works in the low frequency state to charge the output capacitor and is maintained the constant voltage.

When the charge amount of the output capacitor increases to a predetermined value as the output capacitor is charged, i.e., increases to a charge amount that the constant voltage output is achieved by relying on the power solely supplied by the output capacitor, the sampled voltage sampled by the voltage division sampling circuit composed of the first sampling resistor R244 and the second sampling resistor 245 of the voltage sampling circuit T4 is higher. The sampled voltage is inputted to the first pin of the voltage regulator adjuster U0D6, and the current flowing through the first pin and the second pin of the four-pin optocoupler U18 is controlled to become higher by the voltage regulator adjuster U0D6 and is fed back to the third pin and the fourth pin of the primary side of the four-pin optocoupler U18, so that the level of the third pin of the four-pin optocoupler U18 becomes lower. The third pin of the four-pin optocoupler U18 is connected to the fourth pin of the power supply management chip U17 and the deep standby control circuit T1. The level of the third pin of the four-pin optocoupler U18, first used as a voltage regulation feedback signal, is sent to the fourth pin of the power supply management chip U17, controls the power supply management chip U17, then controls the switch tube Q17 and then controls the eight-pin transformer T2 to output a smaller amount of electrical energy and maintain the constant output voltage. At the same time, when the load is the light load, the level of the third pin of the four-pin optocoupler U18 becomes lower, the fourth pin of the power supply management chip U17 is controlled to make the power supply management circuit T5 enter the frequency hopping mode and make the switch tube to work in the low frequency state with 25 kHz, thereby reducing the power consumption of the switch tube. Next, the level of the third pin of the four-pin optocoupler U18, used as a deep standby control signal, makes the power supply management chip U17 enter the deep sleep mode after processed by the signal processing circuit, i.e., the power supply management chip U17 stops working, and the load is powered by electric charges stored on the output capacitor CE10. After that, these operations are repeated in a similar way, the power supply management chip U17 enters the deep sleep mode by controlling the fifth pin of the power supply management chip U17, such that the standby power consumption is reduced and the eight-pin transformer T2 has no noise when the electric equipment is in the standby state.

Optionally, the smaller the output load becomes (to the degree that only an indicator light consumes the power), the slower the voltage of the output capacitor CE10 decreases, i.e., the slower the level of the third pin of the four-pin optocoupler U18 is increased, the longer the time that the power supply management chip U17 is in the sleep, and the lower the standby power consumption becomes (to the degree to only maintain the consumption of the indicator light).

When the output load is the heavy load, the voltage of the output capacitor CE10 is greatly reduced. With the above-mentioned principle, after sampled by the voltage sampling circuit R245 (i.e., the second sampling resistor R245) and the first sampling resistor R244, the output voltage is fed back to the primary side through the optocoupler feedback circuit T3. At this point, the feedback amount is large and the level of the third pin of the four-pin optocoupler U18 is higher. The level of the third pin of the four-pin optocoupler U18, first used as the deep standby control signal, is processed by the signal processing circuit of the deep standby control circuit T1, and then makes the fifth pin of the power supply management chip U17 become a high level, and controls the power supply management chip U17 to exit the deep sleep mode, i.e., makes the power supply management chip U17 start working. Next, the level of the third pin of the four-pin optocoupler U18, used as the voltage regulation feedback signal, is sent to the fourth pin of the power supply management chip U17. The power supply management circuit T5 is controlled according to the level of the third pin of the four-pin optocoupler U18 to output the voltage of the required electrical energy, and the power supply management chip U17 exits the frequency hopping mode, such that the switch tube Q17 works in a high frequency state, and the constant voltage is maintained to charge the load.

The signal processing circuit of the deep standby control circuit T1 includes a trigger switch Q0D12 (i.e., the first triode Q0D12), a timing capacitor C2D36 (i.e., the second capacitor C2D36), a first voltage supply terminal VVC and an enable switch Q0D13 (i.e., the second triode Q0D13). When the load is the light load, i.e., the feedback amount outputted by the four-pin optocoupler U18 is low, i.e., the level of the fourth pin of the four-pin optocoupler U18 is low, the trigger switch is turned off through the second resistor R3D86 and the third resistor R3D87, and the timing capacitor C2D36 is charged by the VCC via the voltage regulator tube D0D22 and a current limiting resistor, that is the first resistor R3D85. When the timing capacitor is fully charged, the current flowing through the triode Q0D13 is increased, the enable switch Q0D13 is turned on and in a saturation state, and the level of the fifth pin of the power supply management chip U17 is pulled low to make the chip stop working.

When the voltage of the output capacitor CE10 is reduced, the feedback amount outputted by the four-pin optocoupler U18 is increased, i.e., the level of the fourth pin of the four-pin optocoupler U18 is increased and turns off the trigger switch through the second resistor R3D86 and the third resistor R3D87, the voltages of two terminals of the timing capacitor C2D36 are pulled low instantly, the current flowing through the triode Q0D13 becomes small and the enable switch Q0D13 is turned off, so that the level of the fifth pin of the power supply management chip U17 is automatically increased, the chip starts to work and outputs the constant voltage. When the output power is sufficient to supply power to the load, the feedback amount outputted by the optocoupler feedback circuit T3 is reduced. After that, similarly, the power supply management circuit T5 stops working and enters the deep sleep mode.

When the load is the heavy load, with the same principle, the feedback amount outputted by the optocoupler feedback circuit T3 is high and the trigger switch makes the timing capacitor C2D36 enter the discharge state. When the instantaneous discharge of the timing capacitor C2D36 is completed, the enable switch Q0D13 is controlled to make the power supply management circuit T5 start working to provide the constant voltage to the load.

Optionally, a filter capacitor C2D34 of the deep standby control circuit T1 is configured to prevent the mis-operation of the trigger switch when the output load is a dynamic load. For example, the load of the power amplifier is changed from a heavy load to a light load instantaneously, the feedback amount is a low level due to misjudgment and makes the trigger switch be turned off, and the enable switch Q0D13 is turned on accordingly, the power supply management chip stops working and the output becomes abnormal.

Optionally, the timing capacitor C2D36 of the deep standby control circuit T1 is configured to determine the time to turn off the enable switch Q0D13. During the charging process, the enable switch Q0D13 is in an off state and the power supply management chip is in a working state. When the charging process is completed, the enable switch Q0D13 is turned on and the power supply management chip stops working. Therefore, the function of the timing capacitor is to control the operation time of the power supply management chip when the load is the light load.

Optionally, the light load is a load under the standby state of the electric equipment and the load rate does not exceed 1%. For example, the light load is an indicator light and the load rate is 0.1%. The heavy load is a load whose load rate is more than 80%.

In conclusion, the circuit of the present disclosure determines the feedback amount according to the output load when the electric equipment is in standby. When the load is the light load, a first terminal of the feedback amount controls the power supply management chip to enter the frequency hopping mode and outputs the constant voltage. The first terminal, after a signal processing, automatically controls the power supply management chip to enter the deep sleep mode, i.e., stops a switching state. When the load is the heavy load, the feedback amount is increased, the first terminal controls the power supply management chip to exit the frequency hopping mode and output the constant voltage, and the first terminal automatically controls the power supply management chip to exit the deep sleep mode through signal processing, i.e., starts a switching state. The signal processing circuit of the deep standby control circuit T1 includes the trigger switch, the timing capacitor, the supply voltage and the enable switch, and has a simple circuit structure, a low cost and a small volume. When the load is light, i.e., when the feedback amount outputted by the optocoupler feedback circuit T3 is low, the trigger switch makes the timing capacitor enter the charging state. When the timing capacitor is fully charged, the enable switch is controlled to make the power supply management circuit T5 stop working. When the output load is extremely small (to the degree that only an indicator light consumes the power), the increment of feedback amount of the optocoupler feedback circuit is slower, the time the power supply management chip is in the sleep is longer, and the power consumption in the standby state becomes lower (to the degree to only maintain the consumption of the indicator light).

The circuit of the present disclosure can make the standby indicator light, the infrared receiving device, etc. work normally without the use of a relay, a central processing unit (CPU) or a super capacitor, and the power supply can be automatically turned off according to the load condition and enter the deep sleep mode to reduce the standby power consumption. The power consumption is reduced to a degree of maintaining the energy consumption of only one indicator, which is close to zero power consumption, thereby reducing system cost, simplifying the circuit, and reducing the cost.

Embodiment 4

Figure 6:
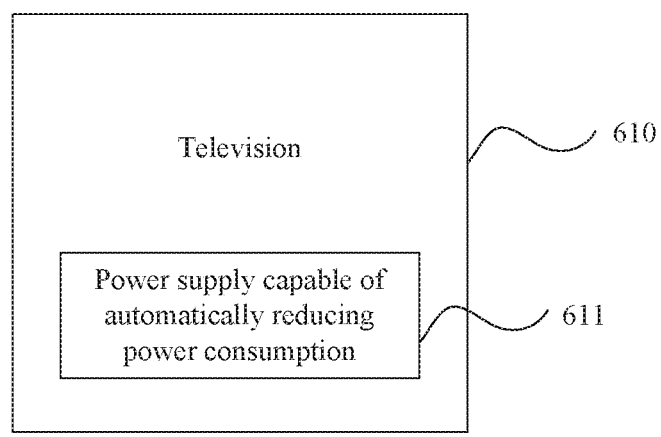
FIG. 6 is a schematic diagram of a television according to an optional embodiment of the present disclosure.

FIG. 6 is a schematic diagram of a television according to an optional embodiment of the present disclosure. With reference to FIG. 6, a television 610 in the present embodiment includes a power supply 611 capable of automatically reducing power consumption in the embodiment 3.

The power supply 611 capable of automatically reducing its own power consumption of the television 610 can make the devices of the television 610, such as a standby indicator light, an infrared receiving and the like work normally without the use of a relay, a CPU or a super capacitor, thereby simplifying the circuit of the power supply of the television and reducing the cost of the television. When the television is in standby, the television intermittently automatically enters a deep sleep mode, such that the standby power consumption of the television is close to zero, and no noise exists, thereby effectively reducing the standby power consumption of the television, saving power resources and improving the user experience.

What is claimed is:

1. A method for reducing power consumption of a power supply, comprising:
   operating a voltage sampling circuit to acquire a voltage of an output capacitor;
   if the acquired voltage is a first preset voltage, operating an optocoupler feedback circuit to receive the first preset voltage and output a second level; operating a deep standby control circuit to receive the second level and control a power supply management circuit to start working; and operating the power supply management circuit to receive the second level, output a first constant voltage according to the second level and charge the output capacitor; and
   if the acquired voltage is a second preset voltage, operating the optocoupler feedback circuit to receive a second preset voltage and output a first level; operating the power supply management circuit to receive the first level and output a second constant voltage according to the first level; and operating the deep standby control circuit to receive the first level and control, after a turn-off time of a triode in the deep standby control circuit, the power supply management circuit to stop working and operating the output capacitor to power a load,
   wherein the first preset voltage is less than the second preset voltage, and the first level is less than the second level.

2. The method according to claim 1, wherein the operating a deep standby control circuit to receive the second level and control a power supply management circuit to start working comprises: operating a trigger switch of the deep standby control circuit to receive the second level, controlling a timing capacitor of the deep standby control circuit to enter a discharge state, and controlling an enable switch of the deep standby control circuit to make the power supply management circuit to start working when an instantaneous discharge of the timing capacitor is completed;
   and wherein the operating the deep standby control circuit to receive the first level and control, after the turn-off time of the triode in the deep standby control circuit, the power supply management circuit to stop working comprises: operating the trigger switch to receive the first level, controlling the timing capacitor to enter a charging state, and controlling the enable switch to make the power supply management circuit stop working when a charging of the timing capacitor is completed.

3. The method according to claim 1, after the operating a voltage sampling circuit to acquire a voltage of an output capacitor, further comprising:
   if the acquired voltage is the first preset voltage, operating the optocoupler feedback circuit to receive the first preset voltage and output the second level; operating the deep standby control circuit to receive the second level and control the power supply management circuit to start working; and operating the power supply management circuit to receive the second level, output the first constant voltage according to the second level and power the load.

4. A power supply capable of automatically reducing power consumption thereof, comprising: a voltage sampling circuit, an optocoupler feedback circuit, a deep standby control circuit, a power supply management circuit and an output rectifier filter, wherein the output rectifier filter comprises an output capacitor;
   wherein the voltage sampling circuit is configured to acquire a voltage of the output capacitor;
   if the acquired voltage is a first preset voltage, the optocoupler feedback circuit is configured to receive a first preset voltage and output a second level; the deep standby control circuit is configured to receive the second level and control the power supply management circuit to start working; and the power supply management circuit is configured to receive the second level, output a first constant voltage according to the second level and charge the output capacitor; and
   if the acquired voltage is a second preset voltage, the optocoupler feedback circuit is configured to receive the second preset voltage and output a first level; the power supply management circuit is configured to receive the first level and output a second constant voltage according to the first level; and the deep standby control circuit is further configured to receive the first level and control, after a turn-off time of a triode in the deep standby control circuit, the power supply management circuit to stop working and a load is powered by the output capacitor.

5. The power supply according to claim 4, wherein the deep standby control circuit comprises a trigger switch, a timing capacitor, a power supply winding and an enable switch;
   wherein an input terminal of the trigger switch is connected to an output terminal of the optocoupler feedback circuit, and an output terminal of the trigger switch and an output terminal of the power supply winding are connected to an input terminal of the timing capacitor, an output terminal of the timing capacitor is connected to an input terminal of the enable switch, and an output terminal of the enable switch is connected to an input terminal of the power supply management circuit; wherein the input terminal of the trigger switch is used as an input terminal of the deep standby control circuit and the output terminal of the enable switch is used as an output terminal of the deep standby control circuit;

when the trigger switch of the deep standby control circuit receives the second level, the timing capacitor of the deep standby control circuit is controlled to enter a discharge state, and when an instantaneous discharge of the timing capacitor is completed, the enable switch of the deep standby control circuit is controlled to make the power supply management circuit start working; and when the trigger switch receives the first level, the timing capacitor is controlled to enter a charging state, and when a charging of the timing capacitor is completed, the enable switch is controlled to make the power supply management circuit stop working.

6. The power supply according to claim 4, further comprising: an electromagnetic interference (EMI) filter, a rectifier filter, a transformer and a switch tube; wherein an input terminal of the EMI filter is connected to the power supply, an output terminal of the EMI filter is connected to an input terminal of the rectifier filter, an input terminal of the switch tube is connected to an output terminal of the power supply management circuit, an output terminal of the switch tube and an output terminal of the rectifier filter are connected to an input terminal of the transformer, an output terminal of the transformer is connected to an input terminal of the output rectifier filter, and an output terminal of the output rectifier filter is connected to the load.

7. The power supply according to claim 4, wherein the deep standby control circuit comprises: a first resistor, a second resistor, a third resistor, a fourth resistor, a first triode, a second triode, a voltage regulator tube, a first capacitor and a second capacitor; wherein the first triode and the second triode are NPN triodes; and a first terminal of the third resistor is respectively connected to a first terminal of the second resistor and a first terminal of the first capacitor, a second terminal of the second resistor is used as an input terminal of the deep standby control circuit, a second terminal of the third resistor is connected to a base of the first triode, a collector of the first triode is respectively connected to a first terminal of the first resistor, a first terminal of the fourth resistor, a first terminal of the second capacitor and a base of the second triode, a second terminal of the first resistor is connected to a positive electrode of the voltage regulator tube, a negative electrode of the voltage regulator tube is connected to a first voltage supply terminal, a collector of the second triode is used as an output terminal of the deep standby control circuit, a second terminal of the first capacitor, an emitter of the first triode, a second terminal of the fourth resistor, a second terminal of the second capacitor, and an emitter of the second triode are grounded.

8. The power supply according to claim 4, wherein the voltage sampling circuit comprises a first sampling resistor and a second sampling resistor, and the optocoupler feedback circuit comprises: a fifth resistor, a sixth resistor, a third capacitor, a voltage regulator adjuster and a four-pin optocoupler; wherein a first pin of the voltage regulator adjuster is respectively connected to a first terminal of the first sampling resistor, a first terminal of the second sampling resistor and a first terminal of the third capacitor, a second terminal of the third capacitor is connected to a first terminal of the fifth resistor, a second terminal of the second sampling resistor is connected to a second voltage supply terminal, a second terminal of the fifth resistor is respectively connected to a second pin of the voltage regulator adjuster and a second pin of the four-pin optocoupler, a first pin of the four-pin optocoupler is connected to a first terminal of the sixth resistor, a second terminal of the sixth resistor is connected to the second voltage supply terminal, a fourth pin of the four-pin optocoupler is connected to a first voltage supply terminal, a third pin of the four-pin optocoupler is used as the output terminal of the optocoupler feedback circuit and connected to the input terminal of the deep standby control circuit, and a second terminal of the first sampling resistor and a third pin of the voltage regulator adjuster are grounded.

9. The power supply according to claim 6, wherein the power supply management circuit comprises a power supply management chip, a polar capacitor, a first diode and a seventh resistor; the switch tube comprises a metal oxide semiconductor field effect transistor (MOSFET), which is an N-channel enhanced MOSFET; the rectifier filter comprises a rectifier bridge; and the transformer comprises an eight-pin transformer;

a fourth pin of the power supply management chip is respectively connected to the output terminal of the optocoupler feedback circuit and the input terminal of the deep standby control circuit, a fifth pin of the power supply management chip is connected to the output terminal of the deep standby control circuit, a seventh pin of the power supply management chip is respectively connected to a source of the MOSFET and a first terminal of the seventh resistor, a drain of the MOSFET is connected to a third pin of the transformer, a first pin of the transformer is connected to a first pin of the rectifier bridge, a second pin and a third pin of the rectifier bridge are connected to the output terminal of the EMI filter, the input terminal of the EMI filter is connected to an alternating current (AC) power socket, a fifth pin of the transformer is connected to a positive electrode of the first diode, a negative electrode of the first diode is respectively connected to a tenth pin of the power supply management chip, the first voltage supply terminal and a positive electrode of the polar capacitor, an eighth pin of the transformer is connected to the input terminal of the output rectifier filter, and a sixth pin of the transformer, a seventh pin of the transformer, a second terminal of the seventh resistor, a negative electrode of the polar capacitor, an eighth pin of the power supply management chip and a fourth pin of the rectifier bridge are grounded.

10. The power supply according to claim 4, wherein the output rectifier filter comprises a second diode and an output capacitor, wherein a positive electrode of the second diode is used as an input terminal of the output rectifier filter, a negative electrode of the second diode is respectively connected to a positive electrode and a negative electrode of the output capacitor, and the negative electrode of the output capacitor is grounded.

11. A television, comprising a power supply automatically reducing power consumption, wherein the power supply automatically reducing power consumption comprises a voltage sampling circuit, an optocoupler feedback circuit, a deep standby control circuit, a power supply management circuit and an output rectifier filter; wherein the output rectifier filter comprises an output capacitor, the voltage sampling circuit acquires a voltage of the output capacitor;

if the acquired voltage is a first preset voltage, the optocoupler feedback circuit is configured to receive the first preset voltage and output a second level, the deep standby control circuit is configured to receive the second level and control the power supply management circuit to start working; and the power supply management circuit is configured to receive the second level, output a first constant voltage according to the second level and charge the output capacitor; and if the acquired voltage is a second preset voltage, the optocoupler feedback circuit is further configured to receive the second preset voltage and output a first level; the power supply management circuit is configured to receive the first level and output a second constant voltage according to the first level; and the deep standby control circuit is further configured to receive the first level and control, after a turn-off time of a triode in the deep standby control circuit, the power supply management circuit to stop working and a load is powered by the output capacitor.

12. The television according to claim 11, wherein the deep standby control circuit comprises a trigger switch, a timing capacitor, a power supply winding and an enable switch, an input terminal of the trigger switch is connected to an output terminal of the optocoupler feedback circuit, an output terminal of the trigger switch and an output terminal of the power supply winding are connected to an input terminal of the timing capacitor, an output terminal of the timing capacitor is connected to an input terminal of the enable switch, and an output terminal of the enable switch is connected to an input terminal of the power supply management circuit, wherein the input terminal of the trigger switch is used as an input terminal of the deep standby control circuit, and the output terminal of the enable switch is used as an output terminal of the deep standby control circuit;

when the trigger switch of the deep standby control circuit receives the second level, the timing capacitor of the deep standby control circuit is controlled to enter a discharge state, and when an instantaneous discharge of the timing capacitor is completed, the enable switch of the deep standby control circuit is controlled to make the power supply management circuit start working; and when the trigger switch receives the first level, the timing capacitor is controlled to enter a charging state, and when a charging of the timing capacitor is completed, the enable switch is controlled to make the power supply management circuit stop working.

13. The television according to claim 11, further comprising: an electromagnetic interference (EMI) filter, a rectifier filter, a transformer and a switch tube, an input terminal of the EMI filter is connected to the power supply, an output terminal of the EMI filter is connected to an input terminal of the rectifier filter, an input terminal of the switch tube is connected to an output terminal of the power supply management circuit, an output terminal of the switch tube and an output terminal of the rectifier filter are connected to an input terminal of the transformer, an output terminal of the transformer is connected to an input terminal of the output rectifier filter, and an output terminal of the rectifier filter is connected to a load.

14. The television according to claim 11, wherein the deep standby control circuit comprises: a first resistor, a second resistor, a third resistor, a fourth resistor, a first triode, a second triode, a voltage regulator tube, a first capacitor and a second capacitor, wherein the first triode and the second triode are NPN triodes; and a first terminal of the third resistor is respectively connected to a first terminal of the second resistor and a first terminal of the first capacitor, a second terminal of the second resistor is used as an input terminal of the deep standby control circuit, a second terminal of the third resistor is connected to a base of the first triode, a collector of the first triode is respectively connected to a first terminal of the first resistor, a first terminal of the fourth resistor, a first terminal of the second capacitor and a base of the second triode, a second terminal of the first resistor is connected to a positive electrode of the voltage regulator tube, a negative electrode of the voltage regulator tube is connected to a first voltage supply terminal, a collector of the second triode is used as an output terminal of the deep standby control circuit, a second terminal of the first capacitor, an emitter of the first triode, a second terminal of the fourth resistor, a second terminal of the second capacitor and an emitter of the second triode are grounded.

15. The television according to claim 11, wherein the voltage sampling circuit comprises a first sampling resistor and a second sampling resistor; the optocoupler feedback circuit comprises: a fifth resistor, a sixth resistor, a third capacitor, a voltage regulator adjuster and a four-pin optocoupler, a first pin of the voltage regulator adjuster is respectively connected to a first terminal of the first sampling resistor, a first terminal of the second sampling resistor and a first terminal of the third capacitor, a second terminal of the third capacitor is connected to a first terminal of the fifth resistor, a second terminal of the second sampling resistor is connected to a second voltage supply terminal, a second terminal of the fifth resistor is respectively connected to a second pin of the voltage regulator adjuster and a second pin of the four-pin optocoupler, a first pin of the four-pin optocoupler is connected to a first terminal of the sixth resistor, a second terminal of the sixth resistor is connected to the second voltage supply terminal, a fourth pin of the four-pin optocoupler is connected to a first voltage supply terminal, a third pin of the four-pin optocoupler is used as the output terminal of the optocoupler feedback circuit and connected to the input terminal of the deep standby control circuit, and a second terminal of the first sampling resistor and a third pin of the voltage regulator adjuster are both grounded.

\* \* \* \* \*